United States Patent
Nakahara et al.

(10) Patent No.: US 6,908,790 B2
(45) Date of Patent: Jun. 21, 2005

(54) CHIP CARRIER FILM, METHOD OF MANUFACTURING THE CHIP CARRIER FILM AND LIQUID CRYSTAL DISPLAY USING THE CHIP CARRIER FILM

(75) Inventors: Kouki Nakahara, Kikuchi-gun (JP); Hitoshi Morishita, Kikuchi-gun (JP)

(73) Assignee: Advanced Display Inc., Kikuchi-gun (JP)

( * ) Notice: Subject to any disclaimer, the term of this patent is extended or adjusted under 35 U.S.C. 154(b) by 0 days.

(21) Appl. No.: 10/698,452

(22) Filed: Nov. 3, 2003

(65) Prior Publication Data

US 2004/0164429 A1 Aug. 26, 2004

Related U.S. Application Data

(62) Division of application No. 09/902,154, filed on Jul. 11, 2001, now Pat. No. 6,674,155.

(30) Foreign Application Priority Data

Oct. 19, 2000 (JP) ......................................... 2000-319519

(51) Int. Cl.[7] .......................... H01L 21/48; H01L 21/50
(52) U.S. Cl. ...................................... 438/108; 438/127
(58) Field of Search ............................... 438/106, 108, 438/112, 124, 125, 126, 127

(56) References Cited

U.S. PATENT DOCUMENTS

| 5,949,502 A | 9/1999 | Matsunaga et al. |
| 6,157,085 A | * 12/2000 | Terashima ................... 257/783 |
| 6,388,888 B1 | 5/2002 | Seko et al. |
| 6,411,359 B1 | 6/2002 | Kobayashi et al. |

FOREIGN PATENT DOCUMENTS

JP 60-134430 6/1983

* cited by examiner

*Primary Examiner*—Michael S. Lebentritt
*Assistant Examiner*—Scott B. Geyer
(74) *Attorney, Agent, or Firm*—Oblon, Spivak, McClelland, Maier & Neustadt, P.C.

(57) ABSTRACT

A chip carrier film comprising a metal wiring formed on a surface of a base film, a first insulating film covering the metal wiring excluding a semiconductor chip connecting pad portion and a terminal connecting pad portion, a semiconductor chip connected to the semiconductor chip connecting pad portion of the metal wiring and mounted on the base film, and a second insulating film formed on a back face of the base film and having a different coefficient of curing shrinkage from that of the first insulating film. It is possible to obtain a chip carrier film capable of preventing the suspension of the base film from being generated by the self weight of the semiconductor chip when holding the base film by the delivery device and of carrying out mounting without a hindrance.

4 Claims, 7 Drawing Sheets

CHIP CARRIER FILM, METHOD OF MANUFACTURING THE CHIP CARRIER FILM AND LIQUID CRYSTAL DISPLAY USING THE CHIP CARRIER FILM

This application is a division of 09/902,154 filed Jul. 11, 2001 now U.S. Pat. No. 6,674,155.

BACKGROUND OF THE INVENTION

The present invention relates to a chip carrier film in which an insulating film provided on a surface of a base film has a different coefficient of curing shrinkage from that of an insulating film provided on the back of the film and a method of manufacturing the chip carrier film, and a liquid crystal display using the chip carrier film.

Figure 5:
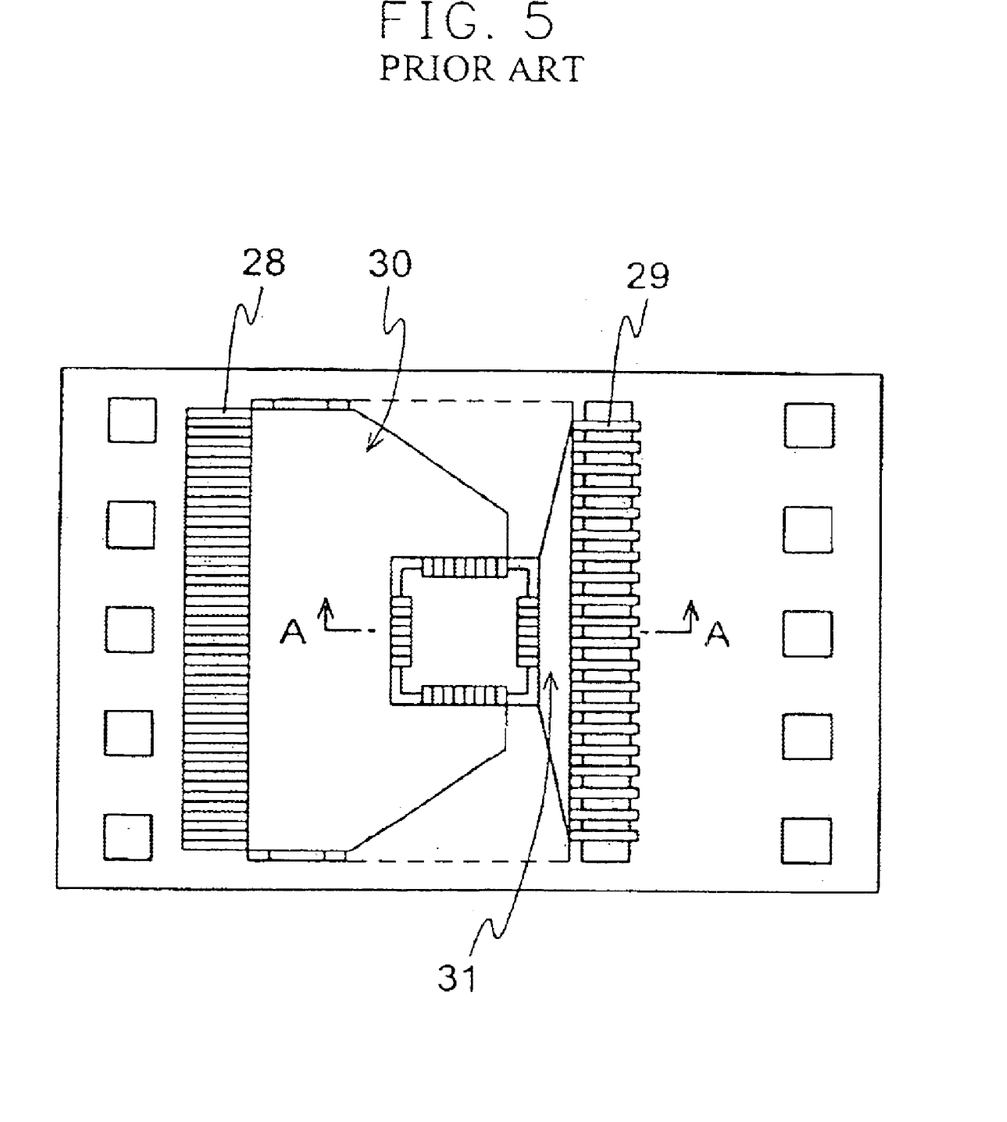
FIG. 5 is a plan view illustrating a TCP according to the conventional art.
Figure 6:
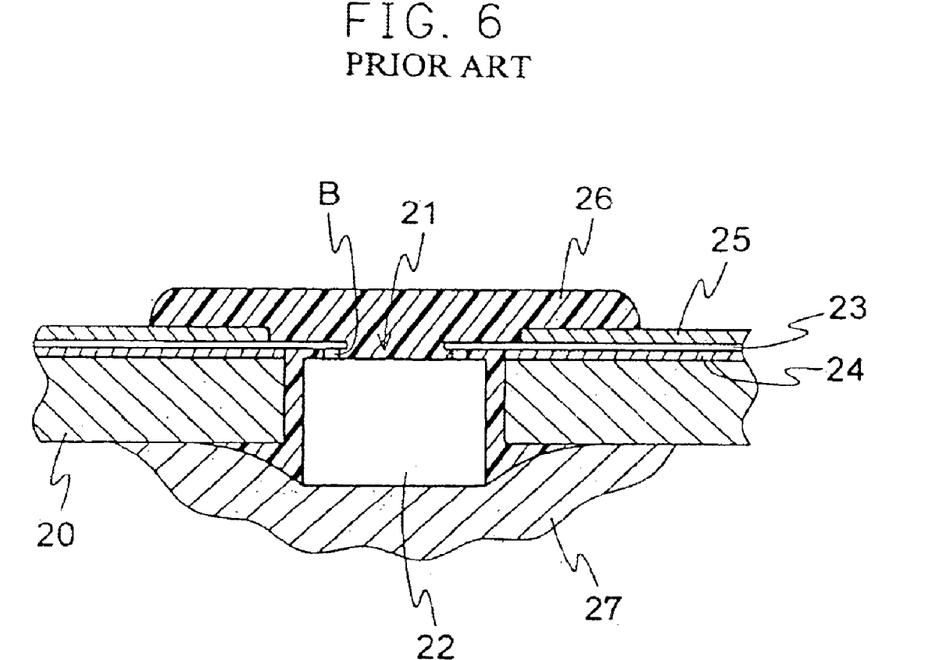
FIG. 6 is an enlarged sectional view taken along the line A—A in the TCP according to the conventional art.

There has widely been used a TCP (Tape Carrier Package) mount method of connecting a liquid crystal display panel and a circuit board through a film mounting thereon a driver IC (for example, Japanese Unexamined Patent Publication No. 169793/1995). Based on the Japanese Unexamined Patent Publication No. 169793/1995, the structure of the TCP will be summarized. FIG. 5 is a plan view showing the TCP and FIG. 6 is an enlarged sectional view taken along the line A—A in FIG. 5. In a device hole 21 provided on a base film 20 formed of polyimide, a driver IC 22 is connected through a bump to a circuit pattern (a copper foil plated with tin) 23 provided on the film 20. The circuit pattern 23 is formed on the base film 20 through an adhesive layer 24 and the surface of the circuit pattern 23 is covered with a solder resist 25 and is thus protected. Moreover, a high reliability resin (sealing material) 26 and a reinforcing resin 27 are provided around the driver IC 22. The circuit pattern 23 has connecting terminal pads 28 and 29 and inner leads 30 and 31 connected thereto.

However, the TCP has the following problems.

(1) Fine pitch (corresponding to a 40 μm pitch)

With an increase in fineness of the liquid crystal display panel, an advanced mounting technique for implementing a fine pitch corresponding to a 40 μm pitch has been desired. The fine pitch of a copper wiring formed on the film is closely related to a thickness thereof. More specifically, it has been supposed that the thickness (17 to 35 μm) of a conventional copper wiring is to be reduced to approximately 10 μm. However, if the thickness of the copper wiring is reduced, there is another problem that the copper wiring of a bump connecting portion B in FIG. 6 is bent. Thus, it has been supposed that a very fine pitch is hard to implement through the TCP mount method.

(2) Reduction in manufacturing cost

By the request of a reduction in a frame of the liquid crystal display, a film having a chip mounted thereon is accommodated in the liquid crystal display with the film being bent. Because of the limitations of a manufacturing process of the TCP chip, however, it is hard to reduce the thickness (approximately 70 μm) of the film to be used. Therefore, the bent portion of the film should be subjected to a special processing, resulting in an increase in the manufacturing cost. More specifically, it is necessary to carry out the step of coating the bent portion with a reinforcing resin after providing a slit in the bent portion.

In order to achieve the above-mentioned problems, attention has been paid to a COF (chip on film) mount method for eliminating a device hole of a film and mounting a driver IC on the film in place of the TCP mount method. In the COF, it has been supposed that the thickness of a base film can also be reduced (35 to 40 μm).

Figure 7:
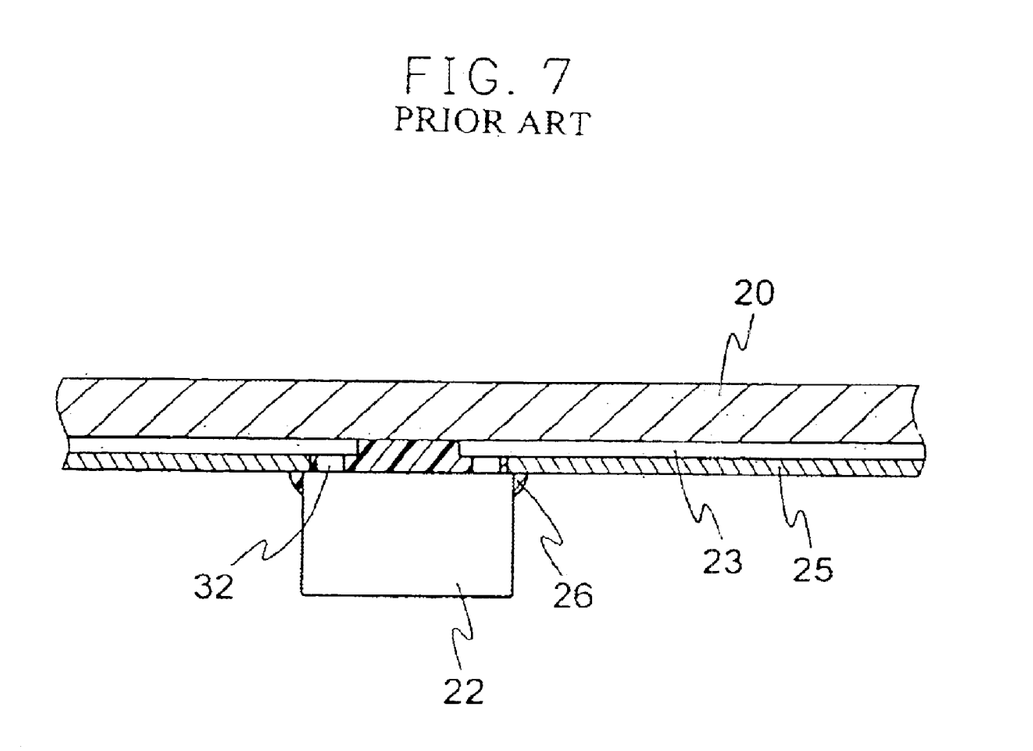
FIG. 7 is a sectional view showing a conventional COF.

FIG. 7 is a sectional view showing a conventional COF in which the driver IC is mounted thereon. A circuit pattern 23 (a copper foil surface plated with tin) to be electrically connected to the driver IC 22 is formed on the surface of the base film 20 (polyimide) and is insulated and protected through the solder resist 25. The driver IC 22 is connected to the circuit pattern 23 through a bump 32 in a portion of the circuit pattern 23 which does not cover the solder resist 25. A resin 26 is applied as a sealing material in the bump connecting portion. Thus, the COF technique is characterized in that the driver IC 22 is mounted on the base film 20 without using the device hole.

Japanese Unexamined Patent Publication No. 215448/1992 has described the basic concept of the COF mount method in which a semiconductor chip can be directly mounted without providing a device hole on a base film of a chip carrier (see column 7, lines 6 to 11).

In case of using an existing COF, however, it has been found that the following problem arises. The number of the COFs to be connected to a 15 inch liquid crystal display panel is more than 10 and less than 20 and a work for mounting the COF on the liquid crystal display panel is carried out through a high speed automatic device. However, the thickness of the base film is reduced (35 to 40 μm) so that the film is easily bent. Consequently, it has been found that a work for delivering the film is very complicated and the manufacture is hindered considerably.

More specifically, in the case in which the high speed automatic device is to be used, it is necessary to mount one of ends of a base film on a liquid crystal display panel in a state in which the other end of the film is held in an arm of the device. Therefore, the base film having a low rigidity is suspended by the self weight of the driver IC chip. Consequently, a situation in which the mounting on the liquid crystal display panel cannot be carried out well is caused easily.

The present invention has been made to solve the above-mentioned problems and has a first object to provide a chip carrier film capable of preventing a base film from being suspended due to the self weight of a semiconductor chip and of carrying out mounting without a hindrance when holding the base film through a delivery device.

It is a second object of the present invention to provide a chip carrier film capable of preventing the base film from being suspended by the self weight of the semiconductor chip, carrying out the mounting without a hindrance and enhancing the reliability of a terminal connection when holding the base film through a delivery device.

It is a third object of the present invention to provide a method of manufacturing a chip carrier film capable of preventing a base film from being suspended due to the self weight of a semiconductor chip and of carrying out mounting without a hindrance when holding the base film through a delivery device.

It is a fourth object of the present invention to provide a liquid crystal display using a chip carrier film capable of preventing a base film from being suspended due to the self weight of a semiconductor chip and of carrying out mounting without a hindrance when holding the base film through a delivery device.

The Japanese Unexamined Patent Publication No. 169793/1995 has disclosed that the problem of the warp of a TCP film base material having an LSI mounted thereon can be solved by coating the back face of a film base material with a resin made of the same material (an epoxy based resin) as a solder resist covering an inner lead (see column 6, paragraph [0028] in the publication, for example).

According to the publication, however, the material of the solder resist and that of the back resin are the same epoxy based resins, which is entirely different from the technical concept of the present invention in which the characteristics of films formed on both surfaces of a film are varied based on a difference in a coefficient of curing shrinkage.

SUMMARY OF THE INVENTION

In accordance with the present invention, there is provided a chip carrier film comprising a metal wiring formed on a surface of a base film, a first insulating film covering the metal wiring excluding a semiconductor chip connecting pad portion and a terminal connecting pad portion, a semiconductor chip connected to the semiconductor chip connecting pad portion of the metal wiring and mounted on the base film, and a second insulating film formed on a back face of the base film and having a different coefficient of curing shrinkage from that of the first insulating film.

In the present specification, the coefficient of curing shrinkage of the insulating film represents a ratio of decrease of a volume obtained when the insulating film is cured through a crosslinking agent.

It is preferable that the coefficient of curing shrinkage of the second insulating film is higher than that of the first insulating film.

It is preferable that the first insulating film and the second insulating film are formed of a thermosetting resin.

It is preferable that a material of the first insulating film is an urethane based resin and a material of the second insulating film is an acryl based resin, an epoxy based resin or a polyimide based resin.

It is preferable that a material of the first insulating film is a polyimide based resin and a material of the second insulating film is an acryl based resin or an epoxy based resin.

It is preferable that a material of the first insulating film is an epoxy based resin and a material of the second insulating film is an acryl based resin.

It is preferable that the base film has a thickness of 35 to 40 µm.

In accordance with the present invention, there is also provided a chip carrier film comprising a terminal connecting pad portion provided on both ends of a surface of a base film, a semiconductor chip carrier region interposed between the terminal connecting pad portions on the ends, a first insulating film formed in a semiconductor chip carrier region on the surface of the base film, and a second insulating film formed in the semiconductor chip carrier region on a back face of the base film and having a different coefficient of curing shrinkage from that of the first insulating film.

It is preferable that the coefficient of curing shrinkage of the second insulating film is higher than that of the first insulating film.

It is preferable that the first insulating film and the second insulating film are formed of a thermosetting resin.

It is preferable that a material of the first insulating film is an urethane based resin and a material of the second insulating film is an acryl based resin, an epoxy based resin or a polyimide based resin.

It is preferable that a material of the first insulating film is a polyimide based resin and a material of the second insulating film is an acryl based resin or an epoxy based resin.

It is preferable that a material of the first insulating film is an epoxy based resin and the material of the second insulating film is an acryl based resin.

In accordance with the present invention, there is further provided a method of manufacturing a chip carrier film comprising the steps of: etching a metal film formed on a surface of a base film to form a metal wiring; coating a first insulating film to cover the metal wiring; mounting a semiconductor chip on the base film to be connected to the metal wiring; coating a back face of the base film with a second insulating film having a different coefficient of curing shrinkage from that of the first insulating film; and curing the first and second insulating films.

It is preferable that the second insulating film having a high coefficient of curing shrinkage than that of the first insulating film is coated and these insulating films are cured.

It is preferable that the first insulating film and the second insulating film are cured by heating.

In accordance with the present invention, there is yet further provided a liquid crystal display device comprising a metal wiring formed on a surface of a base film, a first insulating film covering the metal wiring excluding a semiconductor chip connecting pad portion and a terminal connecting pad portion, a semiconductor chip connected to the semiconductor chip connecting pad portion of the metal wiring and mounted on the base film, a circuit board and a liquid crystal display panel which are connected to the terminal connecting pad portion of the metal wiring, and a second insulating film formed on a back face of the base film and having a different coefficient of curing shrinkage from that of the first insulating film.

It is preferable that the coefficient of curing shrinkage of the second insulating film is higher than that of the first insulating film.

It is preferable that the first insulating film and the second insulating film are formed of a thermosetting resin.

It is preferable that a material of the first insulating film is an urethane based resin and a material of the second insulating film is an acryl based resin, an epoxy based resin or a polyimide based resin.

It is preferable that a material of the first insulating film is a polyimide based resin and a material of the second insulating film is an acryl based resin or an epoxy based resin.

It is preferable that a material of the first insulating film is an epoxy based resin and a material of the second insulating film is an acryl based resin.

It is preferable that the terminal connecting pad portion should be provided on both ends of the base film, one of the ends of the terminal connecting pad portion should be connected to the circuit board and the other end of the terminal connecting pad portion should be connected to the liquid crystal display panel.

It is preferable that the base film has a thickness of 35 to 40 µm.

DETAILED DESCRIPTION

A chip carrier film, a method of manufacturing the chip carrier film and a liquid crystal display device using the chip carrier film according to the present invention will be described below with reference to the accompanying drawings.

Figure 1:
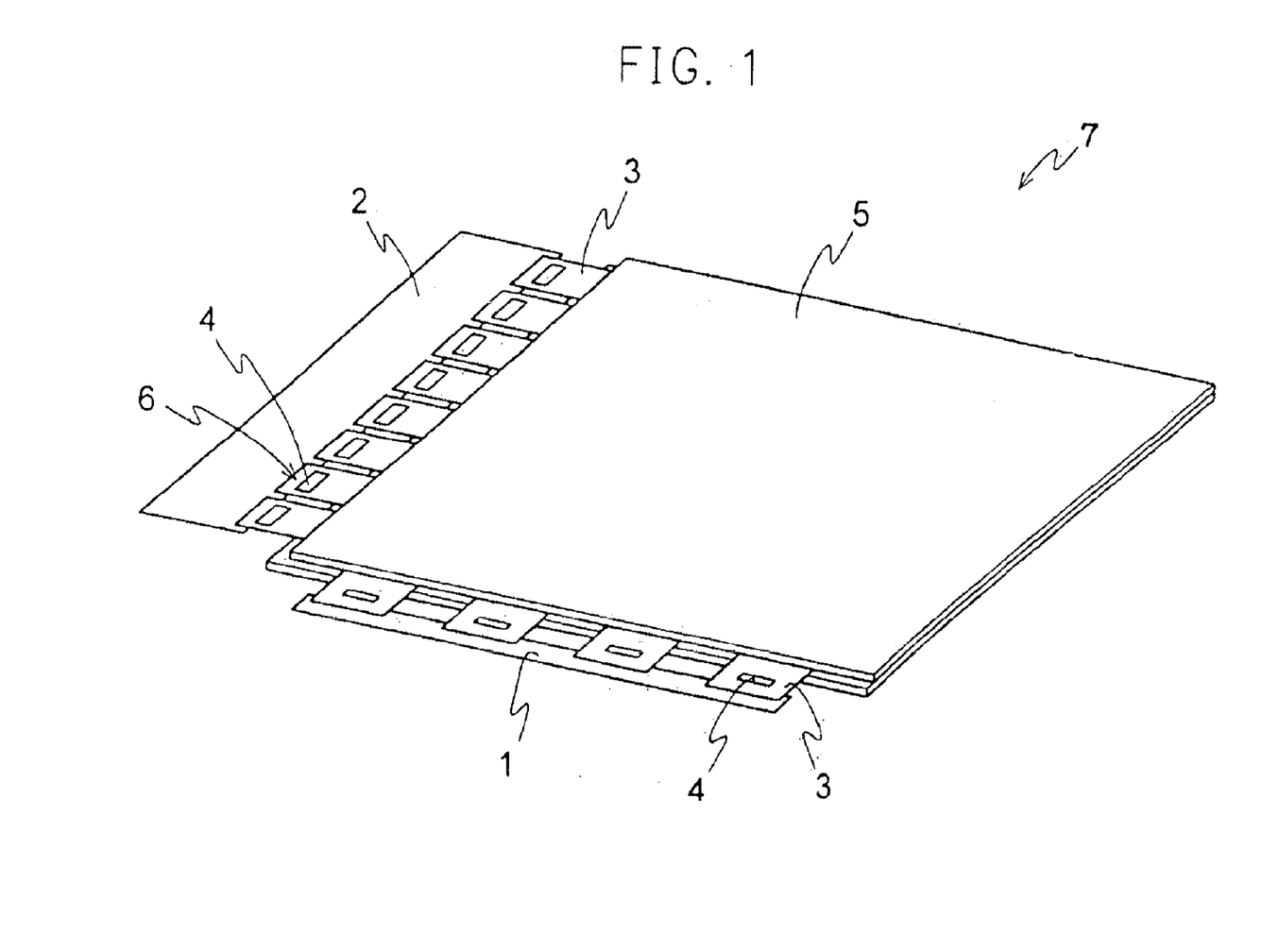
FIG. 1 is a perspective view showing the structure of a liquid crystal display device.
Figure 2:
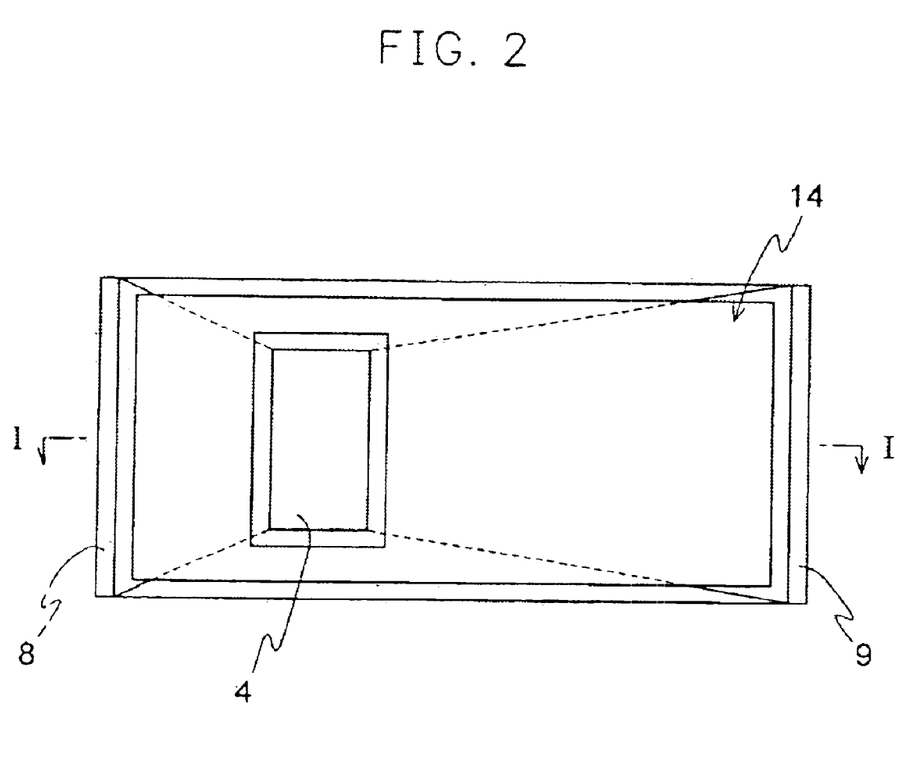
FIG. 2 is a plan view of a COF explained in an embodiment.

FIG. 1 is a perspective view showing a liquid crystal display device in which a circuit board is connected to a liquid crystal display panel through a COF (chip on film). FIG. 2 is an enlarged plan view showing the COF in FIG. 1, and FIG. 3 is a sectional view taken along the line I—I in FIG. 2.

A gate bus circuit board 1 and a source bus circuit board 2 in FIG. 1 receive RGB data and a clock signal from a controller of a personal computer body. These circuit boards 1 and 2 are connected to a connecting pad portion 13 of an input side terminal of a metal wiring 12 of a COF 3 having a driver IC 4 mounted thereon through an ACF (Anisotropic Conductive Film) or a solder. Moreover, a liquid crystal display panel 5 is connected to a connecting pad portion of an output side terminal of the metal wiring 12 of the COF 3 through the ACF. As shown in FIG. 2, terminal connecting pad portions 8 and 9 of the metal wiring 12 are provided on both ends of the COF 3. In a semiconductor chip carrier region 6 between the terminal connecting pad portions 8 and 9, the driver IC 4 is connected to the IC connecting pad portion 13 of the metal wiring 12 through a bump. Thus, a liquid crystal display device 7 shown in FIG. 1 is obtained. A sealing resin 18 is provided around the driver IC 4.

Figure 3:
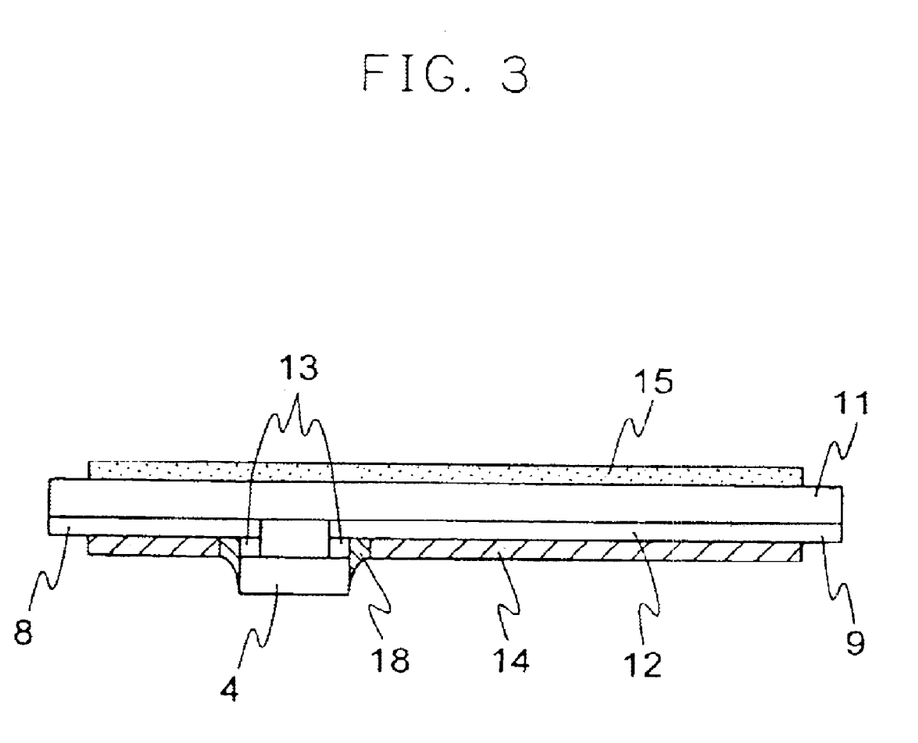
FIG. 3 is a sectional view of the COF explained in the embodiment.

With reference to FIG. 3, the structure of the COF and a manufacturing method thereof will be described in more detail.

Any of reactive ions, neutral ions, electrons and photons are irradiated on the surface of a base film 11 formed of polyimide and the surface is thus roughened. Next, a copper foil is provided on the film and is plated with tin through nonelectrolytic plating. Then, a two-layered metal film having the copper foil and the tin plating is etched to form the metal wiring 12.

In order to insulate and protect an inner lead 10 in the metal wiring 12, next, a solder resist 14 is formed by screen printing to have a thickness of approximately 25 μm after curing such that the metal wiring 12 excluding the terminal connecting pad portions 8 and 9 and the IC connecting pad portion 13 is covered almost completely. For this reason, the metal wiring 12 of the terminal connecting pad portions 8 and 9 and the semiconductor IC connecting pad portion 13 is not covered with the solder resist 14 but is exposed. The driver IC 4 is connected to the metal wiring 12 through a bump in the IC connecting pad portion 13 and is mounted on the base film 11. In order to protect the connection of the driver IC 4 to the metal wiring 12 and to relieve a thermal stress caused by a difference between their coefficients of thermal expansion, furthermore, a sealing resin 18 is provided around the driver IC 4.

The present embodiment is characterized in that a thermal back resin 15 (shown in a dot of FIG. 3) having a higher coefficient of heat curing shrinkage than that of the solder resist 14 is formed through screen printing to have a thickness of approximately 25 μm after curing on the back face of the base film 11 (which is opposite to a face on which the solder resist 14 is formed).

In order to obtain the reliability for the connection of the terminal portion, it is very important that the terminal connecting pad portions 8 and 9 to be connected to the circuit boards 1 and 2 and external circuits of the liquid crystal display panel 5 are maintained to be flat. For this reason, it is necessary to form the back resin 15 in the chip carrier region interposed between the terminal connecting pad portions 8 and 9 and on the back face of the base film 11 such that the connecting terminal pad portions 8 and 9 are not covered. Moreover, it is also necessary to form the solder resist 14 in the chip carrier region.

If the back resin 15 is not provided, the base film 11 is a thin film having a thickness of 35 to 40 μm so that it is suspended by the self weight of the driver IC 4 when one of ends of the back face of the film is held by an automatic delivery arm. In order to avoid such a phenomenon, the back resin 15 having a higher coefficient of heat curing shrinkage than that of the solder resist 14 of the base film 11 is coated and cured. Consequently, the heat curing shrinkage of the solder resist 14 overcomes that of the back resin 15 so that the base film 11 can be warped to be concave-shaped as seen from the back face. Accordingly, the warp of the base film 11 caused by the heat curing shrinkage of the back resin 15 is canceled with the suspension of the base film 11 which is caused by the self weight of the driver IC during delivery so that the COF 3 is maintained to be horizontal. Thus, the COF 3 can be smoothly mounted on the liquid crystal display panel 5.

Description will be given to a mechanism for warping the base film through the shrinkage of a resin.

Figure 4A:
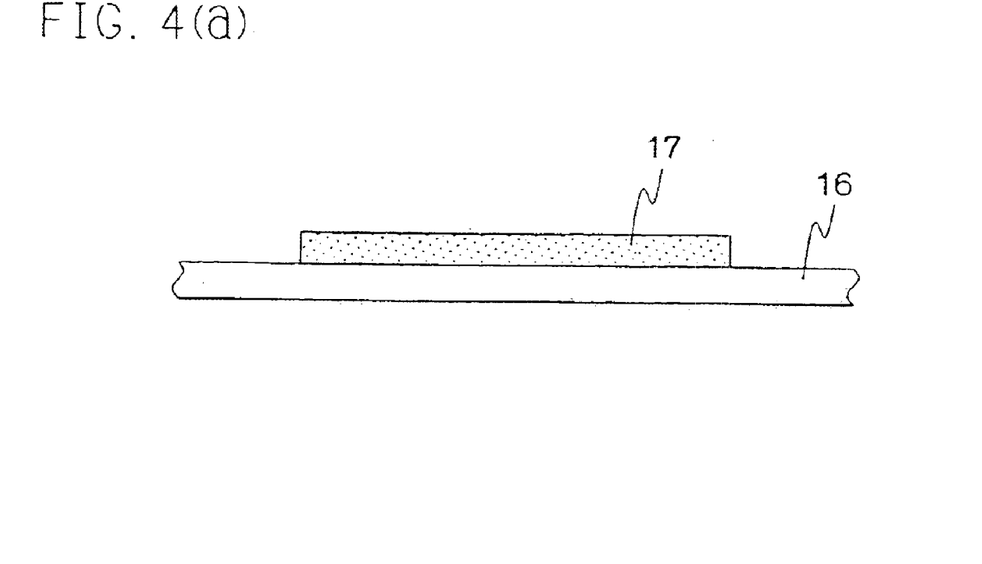
FIG. 4(a) is a sectional view showing a state of a base film coated with a thermosetting resin before a resin is cured and FIG. 4(b) is a sectional view showing a state of the base film coated with the thermosetting resin after the resin is cured.
Figure 4B:
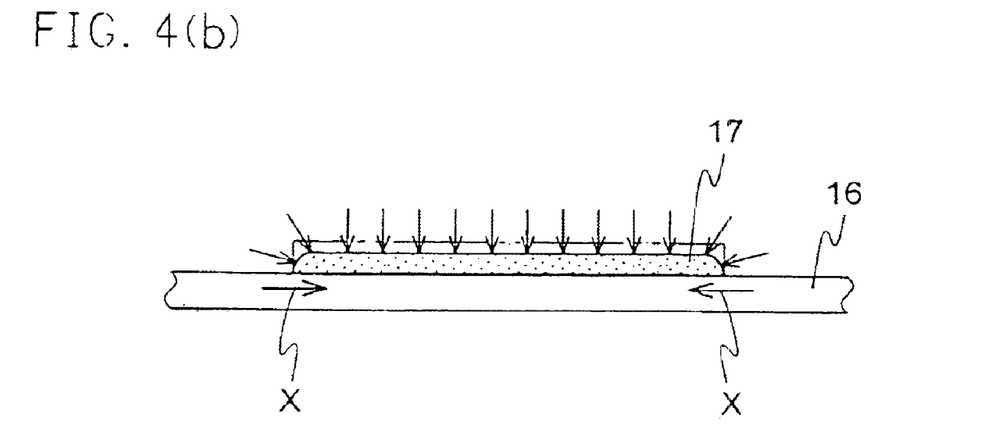

FIG. 4(a) is a sectional view showing a state of the base film coated with a thermosetting resin before a resin is cured, and FIG. 4(b) is a sectional view showing a state of the base film coated with the thermosetting resin after the resin is cured.

When a crosslinking agent is reacted by heating to heat cure the thermosetting resin 17 shown in FIG. 4(a), the volume of the resin is reduced in the curing process. More specifically, the whole thermosetting resin 17 excluding an interface with the base film 16 thermally shrinks based on a predetermined coefficient of heat curing shrinkage as shown in FIG. 4(b). However, the thermosetting resin 17 closely comes in contact with the base film 16 and cannot freely shrink on the interface of the thermosetting resin 17 and the base film 16, and a shearing stress X is generated between the base film 16 and the thermosetting resin 17 based on the curing shrinkage of the thermosetting resin 17.

The shearing stress X bends the base film 16 to be concave-shaped as seen from the upper face side of the resin 17 to generate the function of warping the base film 16.

EMBODIMENT

An experiment of warp observation of the base film was conducted by using four kinds of thermosetting resins, that is, acryl, epoxy, polyimide and urethane based thermosetting resins. The following knowledges (1) to (3) were obtained from the results of the experiment (Experiments 1 to 3) which will be described below.

(1) It has been found that the polyimide based resin, the epoxy based resin or the acryl based resin which has a higher coefficient of shrinkage than that of the urethane based resin can be used for the back resin when the urethane based resin is to be used for the solder resist on the surface of the base film.

(2) It has been found that the epoxy based resin or the acryl based resin which has a higher coefficient of shrinkage than that of the polyimide based resin can be used for the back resin when the polyimide based resin is to be used for the solder resist on the surface of the base film.

(3) It has been found that the acryl based resin having a higher coefficient of shrinkage than that of the epoxy based resin can be used for the back resin when the epoxy based resin is to be used for the solder resist on the surface of the base film.

Experiment 1

Condition of Experiment

① A base film is a polyimide resin (having a thickness of 38 μm).

② The material of a resin of the back face of the base film is an acryl based resin.

The acryl based resin has a coefficient of heat curing shrinkage of 0.04 to $0.05 \times 10^{-3}/°C$.

③ The material of a resin of the surface of the base film is an epoxy based resin.

The epoxy based resin has a coefficient of heat curing shrinkage of 0.02 to $0.03 \times 10^{-3}/°C$.

Result of Experiment

A resin coated on both faces of the base film was thermally cured and this state was observed. The base film was bent to be concave-shaped as seen from a back face thereof.

Experiment 2

Condition of Experiment

① A base film is a polyimide resin (having a thickness of 38 μm).

② The material of a resin of the back face of the base film is an epoxy based resin.

The epoxy based resin has a coefficient of heat curing shrinkage of 0.02 to $0.03 \times 10^{-3}/°C$.

③ The material of a resin of the surface of the base film is a polyimide based resin.

The polyimide based resin has a smaller coefficient of heat curing shrinkage than that of the epoxy based resin.

Result of Experiment

A resin coated on both faces of the base film was thermally cured and this state was observed. The base film was bent to be concave-shaped as seen from a back face thereof.

Experiment 3

Condition of Experiment

① A base film is a polyimide resin (having a thickness of 38 μm).

② The material of a resin of the back face of the base film is a polyimide based resin.

③ The material of a resin of the surface of the base film is an urethane based resin.

The urethane based resin has a smaller coefficient of heat curing shrinkage than that of the polyimide based resin.

Result of Experiment

A resin coated on both faces of the base film was thermally cured and this state was observed. The base film was bent to be concave-shaped as seen from a back face thereof.

While the thermosetting resin has been taken as an example in the present embodiment, the present invention is not restricted thereto but the same effects can be obtained by using, for example, an UV curing resin.

According to the first aspect of the present invention, the coefficient of curing shrinkage of the insulating film pro- vided on the surface of the base film is made different from that of the insulating film provided on the back face thereof. Therefore, the base film can be warped. Consequently, it is possible to obtain a chip carrier film capable of preventing the suspension of the base film from being generated by the self weight of the semiconductor chip when holding the base film by the delivery device and of carrying out mounting without a hindrance.

According to the second aspect of the present invention, the first insulating film is formed in the semiconductor chip region on the surface of the base film, the second insulating film is formed in the semiconductor chip region on the back face thereof, and the coefficients of curing shrinkage of the first and second insulating films are made different from each other. Therefore, the base film can be warped. Consequently, it is possible to obtain a chip carrier film capable of preventing the suspension of the base film from being generated by the self weight of the semiconductor chip when holding the base film by the delivery device, thereby carrying out mounting without a hindrance, and of main- taining the flatness of the terminal connecting pad to enhance the reliability of the connection.

According to the third aspect of the present invention, the coefficient of curing shrinkage of the insulating film pro- vided on the surface of the base film is made different from that of the insulating film provided on the back face thereof. Therefore, the base film can be warped. Consequently, it is possible to obtain a method of manufacturing a chip carrier film capable of preventing the suspension of the base film from being generated by the self weight of the semiconduc- tor chip when holding the base film by the delivery device and of carrying out mounting without a hindrance.

According to the fourth aspect of the present invention, the coefficient of curing shrinkage of the insulating film provided on the surface of the base film is made different from that of the insulating film provided on the back face thereof. Therefore, the base film can be warped. Consequently, it is possible to obtain a liquid crystal display device capable of preventing the suspension of the base film from being generated by the self weight of the semiconduc- tor chip when holding the base film by the delivery device and of carrying out mounting on a liquid crystal display panel without a hindrance.

What is claimed is:

1. A method of manufacturing a chip carrier film com- prising:

etching a metal film formed on a surface of a base film to form a metal wiring;

coating a first insulating film to cover the metal wiring;

mounting a semiconductor chip on the base film to be connected to the metal wiring;

coating a back face of the base film with a second insulating film having a different coefficient of curing shrinkage from that of the first insulating film; and curing the first and second insulating films.

2. The method of claim 1, wherein the second insulating film has a higher coefficient of curing shrinkage than that of the first insulating film, and the first and second insulating films are cured.

3. The method of claim 2, wherein the first insulating film and the second insulating film are cured by heating.

4. The method of claim 1, wherein the first insulating film and the second insulating film are cured by heating.

* * * * *